United States Patent [19]
Shirk et al.

[11] 4,112,139
[45] Sep. 5, 1978

[54] PROCESS FOR RENDERING KAPTON OR OTHER POLYIMIDE FILM PHOTO SENSITIVE TO CATALYST FOR THE DEPOSITION OF VARIOUS METALS IN PATTERN THEREON

[75] Inventors: Albert Shirk, Palmyra; John Peter Redmond, Mechanicsburg, both of Pa.

[73] Assignee: AMP Incorporated, Harrisburg, Pa.

[21] Appl. No.: 724,809

[22] Filed: Sep. 20, 1976

Related U.S. Application Data

[63] Continuation-in-part of Ser. No. 485,410, Jul. 3, 1974, abandoned.

[51] Int. Cl.$^2$ ............................................... C23C 3/02
[52] U.S. Cl. ........................................ 427/54; 427/98; 427/304; 427/306
[58] Field of Search .................. 427/92, 306, 96, 98, 427/304, 305, 54; 106/1

[56] References Cited

U.S. PATENT DOCUMENTS

| | | | |
|---|---|---|---|
| 3,558,352 | 1/1971 | Castrucci et al. | 427/89 |
| 3,573,973 | 4/1971 | Drotar et al. | 427/98 |
| 3,775,121 | 11/1973 | Sharp | 96/38.4 |
| 3,791,939 | 2/1974 | Ferrara et al. | 204/15 |
| 3,821,016 | 6/1974 | De Angelo | 427/54 |

OTHER PUBLICATIONS

Brenner, "Electroless Plating Comes of Age", *Metal Finishing,* Dec. 1954.

*Primary Examiner*—Ralph S. Kendall
*Attorney, Agent, or Firm*—Russell J. Egan

[57] ABSTRACT

Deposition of metal onto a polyimide film by an electroless method is disclosed. The subject method finds particular application in generating metal patterns on polyimide substrates, such as films. The subject method employs a photographic like technique for generating on a polyimide substrate, a pattern capable of attracting thereon a precious metal-salt which is useable as a catalyst in an electroless plating process. The methods disclosed are useable in an electroless plating process to produce a metallic pattern, such as an electric circuit pattern for mounting integrated circuit chips, etc.

12 Claims, No Drawings

PROCESS FOR RENDERING KAPTON OR OTHER POLYIMIDE FILM PHOTO SENSITIVE TO CATALYST FOR THE DEPOSITION OF VARIOUS METALS IN PATTERN THEREON

CROSS REFERENCE TO RELATED APPLICATION

The present application is a continuation-in-part of application Ser. No. 485,410 filed July 3, 1974, now abandoned.

BACKGROUND OF THE INVENTION

With the increasing use of the organic base substrates for providing circuit patterns, greater demands have been placed on the product performance of these circuit patterns, and thus on the organic substrates. These circuit patterns may be formed by various means. An electroless metal deposition method has become increasingly more attractive for forming these patterns.

In general, the closest related process to this invention is an electroless process for depositing a metal such as a noble metal on an organic base. According to the prior art, the process consists of treating the base to accept a catalyst such as a palladium complex or salt in conjunction with a sensitizer therefor, which can be reduced thereafter by photolytic methods thereby rendering the exposed area auto-catalytic to an electroless plating bath. An appropriate illustration of such a method and other prior art methods are shown in U.S. Pat. No. 3,562,005 issued Feb. 9, 1971.

The pattern which can be obtained in the sensitized substrate is obtained by masking selective particular catalyst placement, which is then used as a means to obtain a circuit pattern in an electroless metal deposition bath, and thereafter, if needed by an electrolytic process. The various disadvantages and advantages of the above and competing methods are discussed in U.S. Pat. No. 3,562,005 and need not be repeated herein. Although polyimide films have been treated with hydrazine before, e.g., U.S. Pat. No. 3,395,057, the photolytic, or catalytic activity of the thus treated surface has not been known with respect to modifying surface properties of polyimide polymers for rendering the surface photolytically active.

SUMMARY OF THE INVENTION

According to the present invention, it has been discovered that when polyimide film of polyimides such as disclosed in the patents mentioned in U.S. Pat. No. 3,436,372 are treated with hydrazine or substituted hydrazines or mixtures of same of the formula:

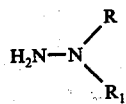

wherein R and $R_1$ as hydrogen, an alkyl of 1 to 4 carbons or mixtures of these radicals in admixture with an alkali hydroxide, the treated polyimide substrate becomes photolytic and when exposed to ultraviolet light, heat, or chemical treatment, the photolytic surface can be destroyed thereby providing a method for desensitizing the photolytic surface of the selected areas. It is emphasized that a hydrazine-alkali solution must be used.

By exposing the polyimide polymer, for example, to ultraviolet light through a masking pattern, a hight degree of resolution can be achieved because the photolytic action affects molecular configurations. Hence, the deposited metal pattern, which is obtained in the non-photolytic area when the polyimide is introduced in an electroless bath, will plate a metal in excellent pattern quality. Moreover, it is a noteworthy fact that exposed areas can be reactivated numerous times after exposure to U. V. light by immersion in a solution of 1% sodium hydroxide and other masking patterns can be provided in the treated area to provide subsequent metallization schemes.

DESCRIPTION OF THE INVENTION

Turning now to the invention and discovery in greater detail, it has been found that the polyimide substrate, when treated with hydrazine and sodium hydroxide (potassium hydroxide can be used) and optionally amines, undergoes a chemical change which makes the polyimide photolytically sensitive in a reversible manner, i.e., the polyimide substrate can be resensitized after photolytic deactivation. Generally, the alkali hydroxide can range from 5% alkali hydroxide, by weight, to 95% hydrazine, by weight, to 95% alkali hydroxide to 5% hydrazine, by weight, the balance being water. Hydrazine is generally available as a solution, typically as a hydrazine hydrate solution of 85%, by weight, balance water.

Hydrazine hydrate such as 85% hydrate solution and sodium hydroxide can be included in a solution with which polyimide is treated. In order to slow the etch rate from maximum etch rate 70% hydrazine hydrate and 30% sodium hydroxide solution (as volume percentages) to a minimum etch rate, a wide range of dilutions may be used.

TABLE I

Effect Of Hydrazine/Caustic Ratios On Weight Loss Of Kapton Film

| 85 Volume percent $N_2H_4 \cdot H_2O$ | 31 Volume percent NaOH | %Wt. Loss/min. |
|---|---|---|
| 100 Vol./% | 0 Vol./% | 0.0 - 0.2 |
| 90 | 10 | 5.5 - 6.5 |
| 80 | 20 | 6.5 - 8.0 |
| 70 | 30 | 8.0 - 9.0 |
| 60 | 40 | 5.5 - 6.5 |
| 50 | 50 | 3.0 - 4.0 |
| 30 | 70 | 2.5 - 3.5 |

Additionally, the solution is stable and may be stored for a prolonged period.

The polyimide substrate such as a film is sold under the trademark KAPTON (also known as H-film) and numerous polyimide varieties have been disclosed such as in the prior art U.S. Pat. No. 3,426,372 issued Apr. 1, 1969, and other prior art literature. Poly (parabanic acid) polymers are described in U.S. Pat. Nos. 3,547,897; 3,591,562 and 3,661,859. The polyimide-amides are described in Lee et al., New Linear Polymers, McGraw-Hill N.Y., N.Y. (1967) pp. 171-204.

It has also been found that before immersion of the film in palladium chloride catalyst solution and spreading the same over the polyimide film, excessive palladium deposit can be controlled by immersion in a 1 percent sodium hydroxide solution after hydrazine/caustic treatment of the surface.

The immersion is prior to catalyst deposition so that the deposited palladium catalyst is controlled and desirable metallization is obtained without undesirable side effects encountered such as blistering of the deposit.

In accordance with the above invention, it has been found that the most desirable aspect and the preferred embodiment of the invention is the immersion of the polyimide film in the hydrazine/caustic solution, the water rinsing of the film and the exposure of the thus treated film to deactivating means such as ultraviolet light, heat, or selected chemical treatment. The exposure to these means will destroy the surface receptive to the palladium salt (which is converted on the surface to a catalytic species of palladium carrying the electroless metal deposition); hence ultraviolet light exposure will not cause a deposition of the metals such as palladium chloride on the substrate. The exposure to ultraviolet light through a masking medium (media) provides for a high degree of resolution. As another aspect of the preferred embodiment, the surface which has been deactivated can be reactivated numerous times with a 1% sodium hydroxide and additional re-exposure to ultraviolet light can provide subsequent and varying metallization schemes.

A light source of ultraviolet light of 2537 Å, will deactivate the alkali hydroxide-hydrazine activated polyimide surface; the contact surface is of the desired circuit pattern. Exposure to light is generally from <1 to 5> minutes, depending upon light source.

The catalyst which can be employed in the present process is Pd $Cl_2$ + HCl.

Of the suitable electroless solutions, which may usefully be employed, a copper bath is disclosed in U.S. Pat. No. 3,562,036. A nickel bath is disclosed in U.S. Pat. No. 3,562,038 and a gold bath is disclosed in U.S. Pat. No. 3,300,328. Additional baths, which may be usefully employed, are available in the art. Still further, a useful electroless gold bath, which can be employed in conjunction with the present activation process to obtain especially outstanding deposits of gold on a polyimide film has been disclosed in copending U.S. patent application Ser. No. 553,047 filed Feb. 25, 1975 now U.S. Pat. No. 4,009,297.

The following hydrazine composition has been prepared for exposing the polyimide substrate:

Composition A
  70% Hydrazine Hydrate
  30% Sodium Hydroxide
Composition B
  25% Hydrazine Hydrate
  75% Sodium Hydroxide
Composition C
  95% Hydrazine Hydrate
  5% Sodium Hydroxide In the above range, hydrazine hydrate is based on an 85%, by weight, overall of hydrazine and 50% sodium hydroxide diluted with an equal volume of water.

The following catalytic metal complex and solutions thereof have been prepared:
  Catalytic Complex—Palladium Chloride/Hydrochloric Acid in a wide range of concentrations. (A typical concentration may be from 0.1 gm to 1.0 gm/ltr.).

The following solution for controlling the amount of catalytic metal deposits has been prepared:
  Control Solution $A^1$—Approximately 1% Sodium Hydroxide higher concentration may be used when less dwell time is desired.

The following tests have been used to determine the end product performance:

For peel strength measurements, 5 samples were tested for each reported value. The specimen were cut from a 6 × 1¾ inch strip of plated stock. The specimens were ¼ wide and 3 inches long. The peel strength were measured by attaching the specimen to a test fixture (German wheel). To initiate the peel, the deposited metal was separated from the Kapton ® by slicing with a surgical knife along the interface at one end of the specimen. The released metal film was clamped in the jaws of an Instron and the German wheel pulled in a downward direction at a rate 0.1 inch/min.

In the examples to follow the various aspects have been illustrated by showing the versatility of the products or methods without limiting, by illustration, the invention and discovery.

EXAMPLE I

A polyimide polymer film, such as Kapton, is immersed from 1 to 3 minutes in an aqueous solution of 70% hydrazine hydrate by volume and 30% of 25% sodium hydroxide by volume then followed by a cold water rinse. The film is then dried by warm air at about 140° F. After drying the previously treated polyimide polymer film is exposed to an ultra violet light source preferably about 2537 Å at about 25 millawatt seconds per $cm^2$ or more directed through a quartz glass with a suitable complementary pattern thereon. After proper time/exposure cycle the film is then immersed in a solution of 0.1 to 1 gm/l palladium chloride and hydrochloric acid of 5–10 ml/l. Areas that have been shielded from the ultraviolet light will accept the $PdCl_2$ and areas exposed will reject such catalyst. Plating will then occur only in the areas where the Kapton has been shielded from ultraviolet light exposure. When a plating bath such as electroless nickel is employed the reduction of metal salts to metal is achieved by the hypophosphite in such baths. When it is desirable to plate electroless copper a reducing agent such as sodium hypophosphite is required prior to immersion in the electroless copper to reduce metal salts to metal.

At no time is a photsensitive material added in the subject process, rather the polyimide is made photosensitive by the above-described method of hydrazine-alkali hydroxide treatment.

In order to provide the necessary distinctions in terminology, hydrazine-alkali hydroxide is a synergistic combination which renders a polyimide polymer surface (by a chemical attack) receptive to a palladium metal salt. This salt is then on the polymide polymer converted to a species of the palladium metal which is catalytic for the deposition of an electroless metal from an electroless metal bath. Hence, hydrazine-alkali hydroxide "sensitizes" the polyimide polymer by affecting the polymer structure thereby rendering it "active" to palladium metal salt. The end result is characterized by an exceptionally tenaciously adhering electroless metal deposit, i.e., adhering to the polymer.

What is claimed is:

1. A method for forming patterns on a polyimide film substrate comprising the steps of: immersing said polyimide in a hydrazine-alkali metal hydroxide solution; exposing selected areas of the thus treated polyimide substrate to a desensitizing means in the form of ultraviolet light of 2537 Å; immersing said substrate in a solution of a catalytic material of palladium salts and hydrochloric acid; and depositing unreduced catalyst material on nondesensitized areas of said substrate.

2. The method as defined in claim 1 wherein after deposition of the catalyst material and subsequent reduction of said catalyst said substrate is immersed in an electroless copper bath.

3. The method as defined in claim 1 wherein after deposition of the catalyst material and subsequent reduction of said catalyst said substrate is immersed in an electroless cobalt bath.

4. The method as defined in claim 1 wherein after deposition of the catalyst material and subsequent reduction of said catalyst said substrate is immersed in an electroless gold bath containing hypophosphate.

5. The method as defined in claim 1 wherein the substrate is immersed in a palladous dichloride solution as the catalytic material and immersed thereafter in an electroless nickel bath containing sodium hypophosphite.

6. The method as described in claim 1 and wherein the substrate is immersed in a palladium salt solution as the catalytic material, and thereafter exposed to an electroless metal plating bath to metallize a palladium containing area of the substrate.

7. The method as defined in claim 6 wherein the hydrazine-alkali metal hydroxide solution has triethanolamine or diethanolamine or monoethanolamine added thereto in a range of 5% by volume to 30% by volume to increase efficiency of solutions by wetting action.

8. A process for sensitizing a polyimide film which comprises the steps of:
(a) sensitizing said polyimide film by immersion in a solution of hydrazine, dimethyl hydrazine, monomethyl hydrazine, or phenyl hydrazine, or mixtures of same in admixture with an alkali metal hydroxide solution;
(b) desensitizing said sensitized polymer in selected areas of the surface by an ultraviolet radiation of less than 3000 Å thereby preserving sensitized areas on said surface of said film;
(c) immersing said film with said sensitized areas into a catalyst solution of palladous salt for deposition of catalyst metal only onto said sensitized areas; and
(d) immersing said film in an electroless metal bath for plating a metal catalytically depositable from said bath by said catalyst solution.

9. The process as defined in claim 8 wherein said catalyst solution comprises a catalyst metal as a salt of solution capable of being rendered active by chemical reduction from other than hypophosphite on said surface and a catalyst reducer for said catalyst salt in said solution.

10. The process as defined in claim 8 and wherein the catalyst deposition is controlled by alkali metal hydroxide treatment and rinse before said catalyst has been deposited on said polyimide surface.

11. The process as defined in claim 8 and wherein said desensitized polyimide is resensitized by immersion in said 1% alkali metal hydroxide solution and said resensitized polyimide is subjected to steps (b)-(c)-(d).

12. The process as defined in claim 11, wherein said resensitized polyimide is subjected to steps (b) and (c).

* * * * *